United States Patent
Amarilio et al.

(10) Patent No.: US 8,760,954 B2
(45) Date of Patent: Jun. 24, 2014

(54) PROTECTION OF STORED DATA USING OPTICAL EMITTING ELEMENTS

(75) Inventors: Lior Amarilio, Yokneam (IL); Uri Bear, Pardes-Hana (IL); Reuven Elbaum, Haifa (IL); Yigal Shapiro, Zichron Yaakov (IL); Chaim D. Shen-Orr, Haifa (IL); Yonatan Shlomovich, Givat Ada (IL); Zvi Shkedy, Karmiel (IL)

(73) Assignee: Cisco Technology Inc., San Jose, CA (US)

( * ) Notice: Subject to any disclaimer, the term of this patent is extended or adjusted under 35 U.S.C. 154(b) by 0 days.

(21) Appl. No.: 13/976,241

(22) PCT Filed: Feb. 19, 2012

(86) PCT No.: PCT/IB2012/050743
§ 371 (c)(1),
(2), (4) Date: Aug. 27, 2013

(87) PCT Pub. No.: WO2012/117311
PCT Pub. Date: Sep. 7, 2012

(65) Prior Publication Data
US 2014/0009995 A1    Jan. 9, 2014

(30) Foreign Application Priority Data
Mar. 3, 2011    (GB) .................................. 1103626.6

(51) Int. Cl.
*G11C 7/00*    (2006.01)

(52) U.S. Cl.
USPC ........... 365/215; 365/175; 365/174; 365/179; 365/180

(58) Field of Classification Search
USPC .......................... 365/215, 175, 174, 179, 180
See application file for complete search history.

(56) References Cited

U.S. PATENT DOCUMENTS

| | | | |
|---|---|---|---|
| 4,910,707 | A | 3/1990 | Schrenk |
| 6,563,480 | B1 | 5/2003 | Nakamura |
| 6,777,757 | B2 | 8/2004 | Peng et al. |
| 7,511,982 | B2 | 3/2009 | Kurjanowicz et al. |
| 7,812,420 | B2 | 10/2010 | Shiu et al. |
| 7,962,767 | B2 | 6/2011 | Walmsley et al. |

(Continued)

FOREIGN PATENT DOCUMENTS

| | | |
|---|---|---|
| FR | 2 500 650 | 8/1982 |
| JP | 61150192 | 7/1986 |

(Continued)

OTHER PUBLICATIONS

Jul. 2, 2012 Transmittal of International Search Report and Written Opinion of the International Searching Authority for captioned application.

May 25, 2011 Office Communication in connection with prosecution of GB 1 103 626.6.

*Primary Examiner* — Vu Le
*Assistant Examiner* — Han Yang
(74) *Attorney, Agent, or Firm* — Husch Blackwell LLP

(57) ABSTRACT

An integrated circuit device (20, 60) includes a plurality of memory cells (22), which are configured to store data. Multiple P-N junctions (24) are arranged so that a single, respective P-N junction is disposed in proximity to each memory cell and is configured to emit optical radiation during readout from the memory cell with a wavelength matching an emission wavelength of the memory cell.

17 Claims, 3 Drawing Sheets

(56) References Cited

U.S. PATENT DOCUMENTS

| | | |
|---|---|---|
| 2004/0159835 A1 | 8/2004 | Krieger et al. |
| 2005/0033705 A1 | 2/2005 | Walmsley et al. |
| 2010/0213878 A1 | 8/2010 | Silverbrook et al. |
| 2011/0304599 A1* | 12/2011 | Yasui .............................. 345/207 |

FOREIGN PATENT DOCUMENTS

| | | |
|---|---|---|
| JP | 1297860 | 11/1989 |
| SU | 1646000 | 4/1991 |
| WO | WO 2009/101483 A1 | 8/2009 |
| WO | WO 2010/011399 A2 | 1/2010 |

* cited by examiner

PROTECTION OF STORED DATA USING OPTICAL EMITTING ELEMENTS

FIELD OF THE INVENTION

The present application is a 35 USC §371 application of PCT/IB2012/050743, filed on 19 Feb. 2012 and entitled "PROTECTION OF STORED DATA USING OPTICAL EMITTING ELEMENTS", which was Published on 7 Sep. 2012 in the English language with International Publication Number WO 2012/117311 and which relies for priority on UK Patent Application 1103626.6 filed 3 Mar. 2011.

The present invention relates generally to electronic devices, and specifically to methods and circuits for prevention of unauthorized data readout from such devices.

BACKGROUND OF THE INVENTION

In some integrated circuits, such as non-volatile memory, readout of data from a memory cell can cause emission of infrared light. Although low in power, such emissions can be detected, particularly if integrated over time while the circuit is in operation. Given sensitive equipment and enough time, it may be possible to use these emissions in order to extract the information that is stored in the cell.

U.S. Patent Application Publication 2010/0213878 describes a method and apparatus for reducing optical emissions in an integrated circuit. The integrated circuit is provided with first circuitry having first and second transistors that emit light during a change in state between states of low and high resistance and second circuitry having third transistors that emit light during a change in state. The third transistors are disposed near at least one of the first and second transistors so that light emissions from the third transistors hinder optical detection of a pattern of light emitted by the first and second transistors.

U.S. Pat. No. 7,962,767 describes an integrated circuit having first and second circuitry which are configured to emit light, when undergoing changes in state. The first and second circuitry are operated to change state at the same time so as to hinder optical detection of the light emitted by the first circuitry.

Various types of one-time programmable memory cells are known in the art. For example, U.S. Pat. No. 6,777,757 describes a programmable memory cell comprising a transistor located at the crosspoint of a column bitline and a row wordline. The transistor has its gate formed from the column bitline and its source connected to the row wordline. The memory cell is programmed by applying a voltage potential between the column bitline and the row wordline to produce a programmed region in the substrate underlying the gate of the transistor.

As another example, U.S. Pat. No. 7,511,982 describes a high-speed sensing scheme for a non-volatile memory array. The memory array includes non-volatile memory cells arranged in a complementary bitline configuration, precharge circuits for precharging the bitlines to a first voltage level such as VSS, a reference circuit for applying a reference charge on the reference bitlines of the complementary bitline pairs, and bitline sense amplifiers for sensing a voltage differential between the complementary bitline pairs. A voltage on the data bitline is changed when a programmed non-volatile memory cell connected to an activated wordline couples the wordline voltage to the data bitline.

U.S. Pat. No. 7,812,420 describes a polydiode structure for a photodiode. An integrated circuit device for converting an incident optical signal into an electrical signal comprises a semiconductor substrate, a well region formed inside the semiconductor substrate, a dielectric layer formed over the well region, and a layer of polysilicon for receiving the incident optical signal, formed over the dielectric layer, including a p-type portion, an n-type portion and an undoped portion disposed. between the p-type and n-type portions. The well region is biased to control the layer of polysilicon for providing the electrical signal.

SUMMARY

Embodiments of the present invention that are described hereinbelow provide methods and circuits for creating optical emissions from a point in proximity to a memory cell, and thereby frustrate attempts to extract the data stored in the cell.

There is therefore provided, in accordance with an embodiment of the present invention, an integrated circuit device, including a plurality of memory cells, which are configured to store data. Multiple P-N junctions are arranged so that a single, respective P-N junction is disposed in proximity to each memory cell and is configured to emit optical radiation during readout from the memory cell with a wavelength matching an emission wavelength of the memory cell.

In certain embodiments, the memory cells may include anti-fuse cells, fuse cells, floating gate cells, or read-only memory (ROM) cells.

In a disclosed embodiment, each memory cell includes a circuit element that emits during readout from the cell, and the respective P-N junction is located at a distance no greater than 0.5 µm from the circuit element.

In some embodiments, the P-N junctions are configured as diodes, such as poly-silicon diodes, which are biased to emit the optical radiation. Typically, each diode is coupled to a respective memory cell so as to receive a forward bias and emit the optical radiation when the respective memory cell is read out. The device may include a readout power line, for supplying a voltage to the memory cells during readout, and a diode power line, wherein each diode is coupled between the readout power line to the respective memory cell and the diode power line. The P-N junctions may be biased at a level that is selected so as to cause the P-N junctions to emit the optical radiation with a wavelength and brightness matching an emission of the memory cells.

In one embodiment, the P-N junctions are coupled to the memory cells so that each P-N junction emits the optical radiation only during readout from the memory cell in proximity to which the P-N junction is disposed. Alternatively, the P-N junctions may be coupled to the memory cells so that multiple P-N junctions emit the optical radiation during readout from one or more of the memory cells. Further alternatively, the P-N junctions may be driven to emit the optical radiation continuously while the device receives electrical power.

In a disclosed embodiment, the memory cells have a given area and, are produced, using a set of photolithographic masks, and the P-N junctions are contained within the given area and produced using the same set of photolithographic masks.

There is also provided, in accordance with an embodiment of the present invention, a method for producing an integrated circuit device. The method includes arranging a plurality of memory cells to store data in the device. Multiple P-N junctions are arranged in the device so that a single, respective P-N junction is disposed in proximity to each memory cell and is configured to emit optical radiation during readout from the memory cell with a wavelength matching an emission wavelength of the memory cell.

The present invention will be more fully understood from the following detailed description of the embodiments thereof, taken together with the drawings in which:

DETAILED DESCRIPTION OF EMBODIMENTS

Figure 1:
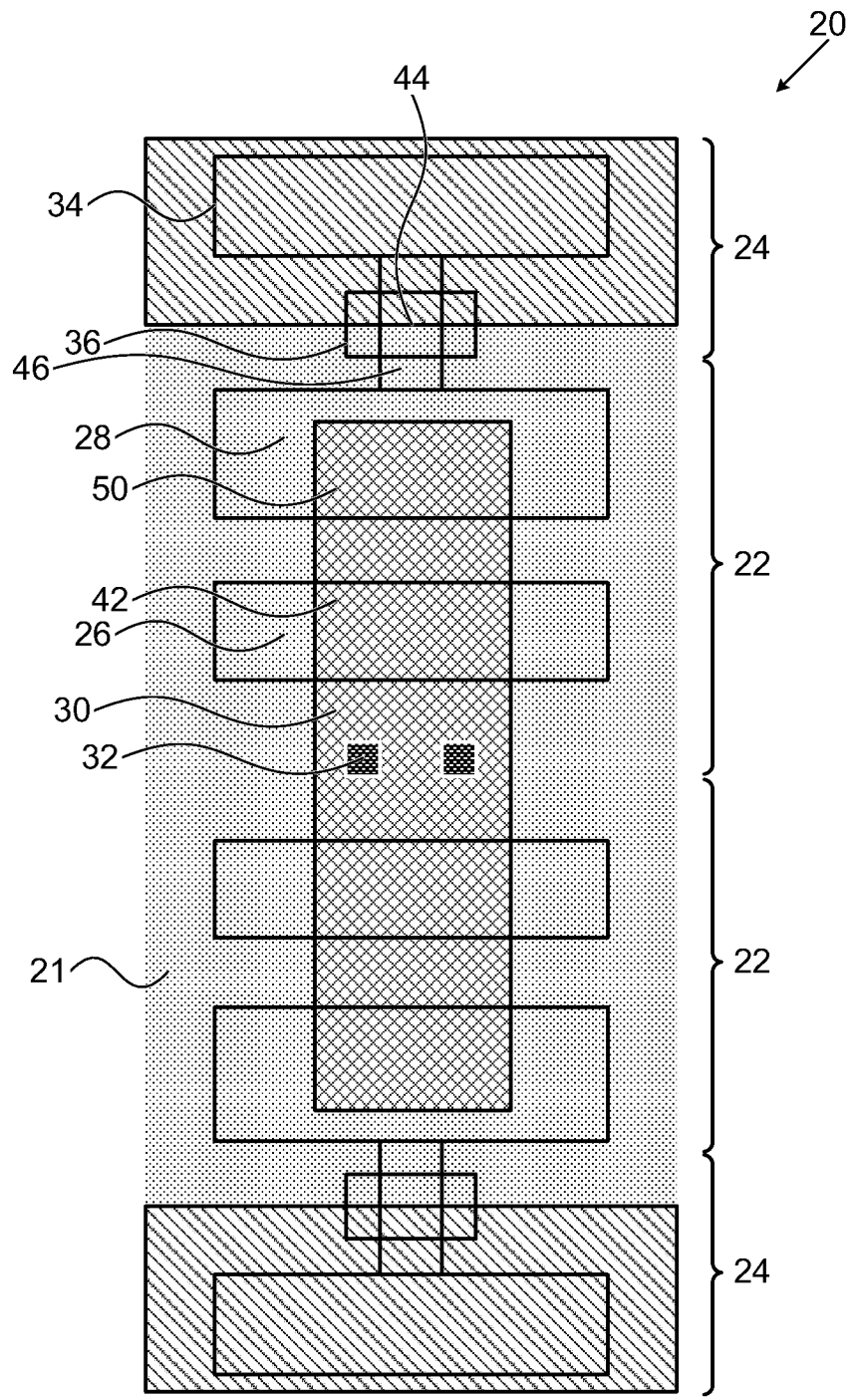
FIG. 1 is a schematic layout of a part of an integrated circuit, in accordance with an embodiment of the present invention.

Some integrated circuit devices store sensitive data, such as encryption keys, in non-volatile memory (NVM), which may comprise, for example, an array of one-time programmable (OTP) memory cells or read-only memory (ROM) cells of other types. As noted earlier, readout from such cells may inherently cause the cells to emit optical radiation. The near-infrared (IR) portion of the emission passes through the silicon substrate and can be sensed from the back side of the memory chip. The emission from any given cell varies depending upon the bit content of the cell. Measuring these emissions may therefore give an indication of the data stored in the memory and may thus enable unauthorized parties to access the data, notwithstanding electronic data protection measures that are implemented in the device.

Sensitive optical instruments are capable, given sufficient measurement time, of detecting the sort of weak radiation that is emitted by the memory cells. Advanced instruments of this sort have sufficient spatial resolution to distinguish between emissions from different cells on the same integrated circuit device and from other emitting elements in the device. There are physical limits, however, on the ultimate resolution of such instruments. In the near-IR range, around 1 μm, for example, where silicon junctions emit radiation, the finest achievable resolution is in the range of 0.25 μm.

Embodiments of the present invention that are described hereinbelow address these issues by arranging r junctions to emit optical radiation in proximity to a set of memory cells, and specifically in proximity to the point from which these memory cells emit radiation. The P-N junctions thus "dazzle-"detectors that may be used in attempts to detect the optical radiation that is emitted from the memory cells. (The term "optical radiation," as used in the context of the present patent application and in the claims, includes visible, infrared and ultraviolet radiation.)

In the disclosed embodiments, a single, respective P-N junction is disposed adjacent to each memory cell and emits optical radiation during readout from the memory cell, at approximately the same wavelength as the memory cell itself. The distance between any given memory cell and the respective P-N junction may be, for example, no more than 0.25 μm, in the range of the resolution limit of measurement devices. Alternatively, larger separation between the memory cell and the P-N junction is possible, such as 0.5 μm, although in such designs it is desirable that the P-N junction, be designed for relatively brighter emission. As a result of the emission from the P-N junction, the emission from the cell upon readout will be indistinguishable from the emission from the P-N junction, thereby frustrating attempts to optically read out the data stored in the memory.

In some embodiments, the P-N junctions are configured as diodes, which are biased to emit the optical radiation. The bias level (i.e., the voltage and direction—forward or backward) may be selected to give the appropriate emission wavelength and brightness to match the emission wavelength of the memory cell and mask the emission from the memory cell. Poly-silicon diodes are particularly advantageous in this regard because of their small size and bright radiation output. Each diode is coupled to its respective memory cell, so as to receive a forward bias and emit the optical radiation when the respective memory cell is read out. Specifically, the diodes may be coupled between the readout power line of the memory cells (which may be fixed or switched) and a dedicated diode power line. The diodes may be coupled to the memory cells in this manner so that each diode emits optical radiation only during readout from the memory cell in proximity to which the diode is disposed.

In alternative embodiments, the P-N junctions may be coupled to the memory cells so that multiple P-N junctions emit optical radiation during readout from one or more of the memory cells. As yet another alternative, the P-N junctions may be driven to emit the optical radiation continuously while the device receives electrical power. Still a further alternative is to drive the P-N junctions to emit radiation during only a part of the readout time or Page: 7only during certain readouts and riot others. For example, some or all of the P-N junctions can be driven to emit radiation, only on every odd read count. In all of these alternative embodiments, the P-N junctions emit optical radiation during readout from he memory cells, but simply with different timing properties.

The embodiments that are shown in the figures and are described hereinbelow relate specifically to devices in which diodes are used as optical emitters in conjunction with OTP anti-fuse cells. The principles of the present invention, however, may equally be applied in protecting the contents of OTP fuse cells, as well as other types of NVM, such as floating gate and ROM cells. Furthermore, although the diodes shown in these embodiments are coupled to the readout power lines of the respective memory cells, the P-N junctions that are used to emit dazzling radiation may be powered and controlled separately from the memory cells.

Figure 2A:
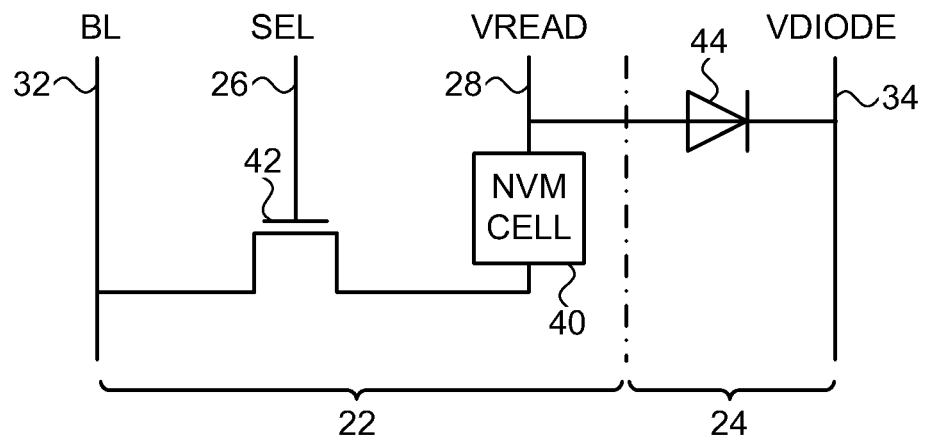
FIGS. 2A and 2B are schematic circuit diagrams showing a memory cell with an associated optical emission unit, in accordance with embodiments of the present invention.
Figure 2B:
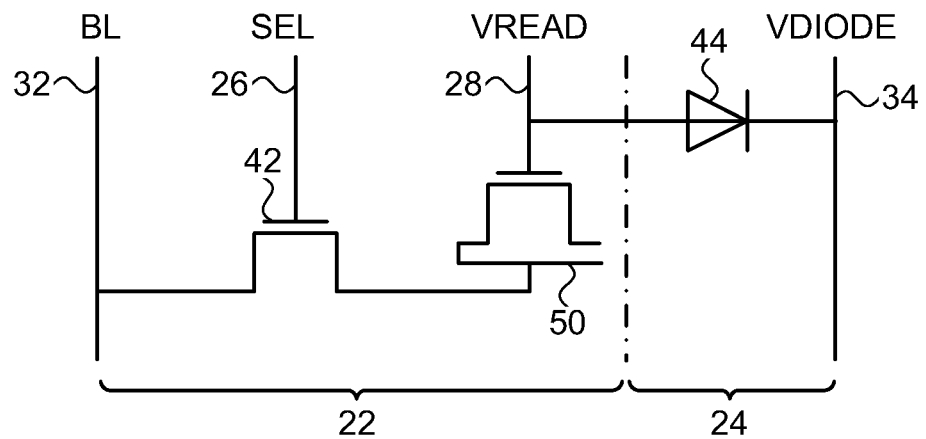

Reference is now made to FIGS. 1, 2A and 2B, which schematically illustrate a part of an integrated circuit 20, in accordance with an embodiment of the present invention. The integrated circuit comprises memory cells 22 along with emission units 24. FIG. 1 is a top view of the actual circuit layout on a silicon substrate 21, including two cells 22 (in this case anti-fuse OTP cells) and two emission units 24. FIGS. 2A and 2B are schematic circuit diagrams showing the electrical connections within and, between a single cell 22 and emission unit 24. In FIG. 2, cell 22 contains a generic non-volatile memory component 40, while FIGS. 1 and 3 specifically show an example of OTP anti-fuse cells with an anti-fuse Page:8 device 50 based on a CMOS capacitor.

As shown in FIG. 1, two cells 22 are formed back-to-back on silicon substrate 21, which is N-doped in the region of cells 22. (All poly-silicon lines in region 22 axe N-doped, as well.) Each cell 22 holds one bit of data. Typically, multiple cells of this types and structure are formed in an array on substrate 21, but only these two cells are shown in FIG. 1 for the sake of simplicity. This particular cell design is shown here by way of example, and emission units 24 may similarly be integrated with other cell designs, such as those described in the patents cited above in the Background section.

One emission unit 24 is formed adjacent to each cell 22. A poly-silicon extension 46 in the region of unit 24 is P-doped on one side and N-doped on the other side, thus creating a P-N junction 44. It can be seen in the figure that the use of this sort of P-N junctions as emitters requires little, or no increase the overall integrated circuit area. In fact, the design of emission units 24 that is shown in FIG. 1 does not increase the cell area at all and requires no additional photolithographic masks for fabrication of the emission units beyond those already used to produce cell 22.

Anti-fuse devices 50 in cells 22 are formed over an active area 30 of the cells. (Poly-silicon lines above this area form the transistors in the cells.) The bit stored in each device 50 is read out by switching a select transistor 42, under control of a select line 26, with power supplied via a VPP/VREAD line 28. Transistor 42 passes the bit values to a bit line 32. During readout, device 50 emits infrared radiation, particularly in the vicinity of its outer edge (at the top and bottom of active area 30 in FIG. 1).

In emission unit 24, poly-line extension 46 connects P-N junction 44 to VPP/VREAD line 28. The other side of junction 44 is connected to a VDIODE line 34 made from polysilicon. The VDIODE line serves as a variable power supply for junction 44, forming a diode. VDIODE may be held at any suitable voltage (including ground) that gives a forward bias across junction 44 during readout of cell 22. To form the P-N junction diode on poly-line extension 46, the polysilicide above the area of junction 44 is removed within a rectangular window 36.

Figure 3:
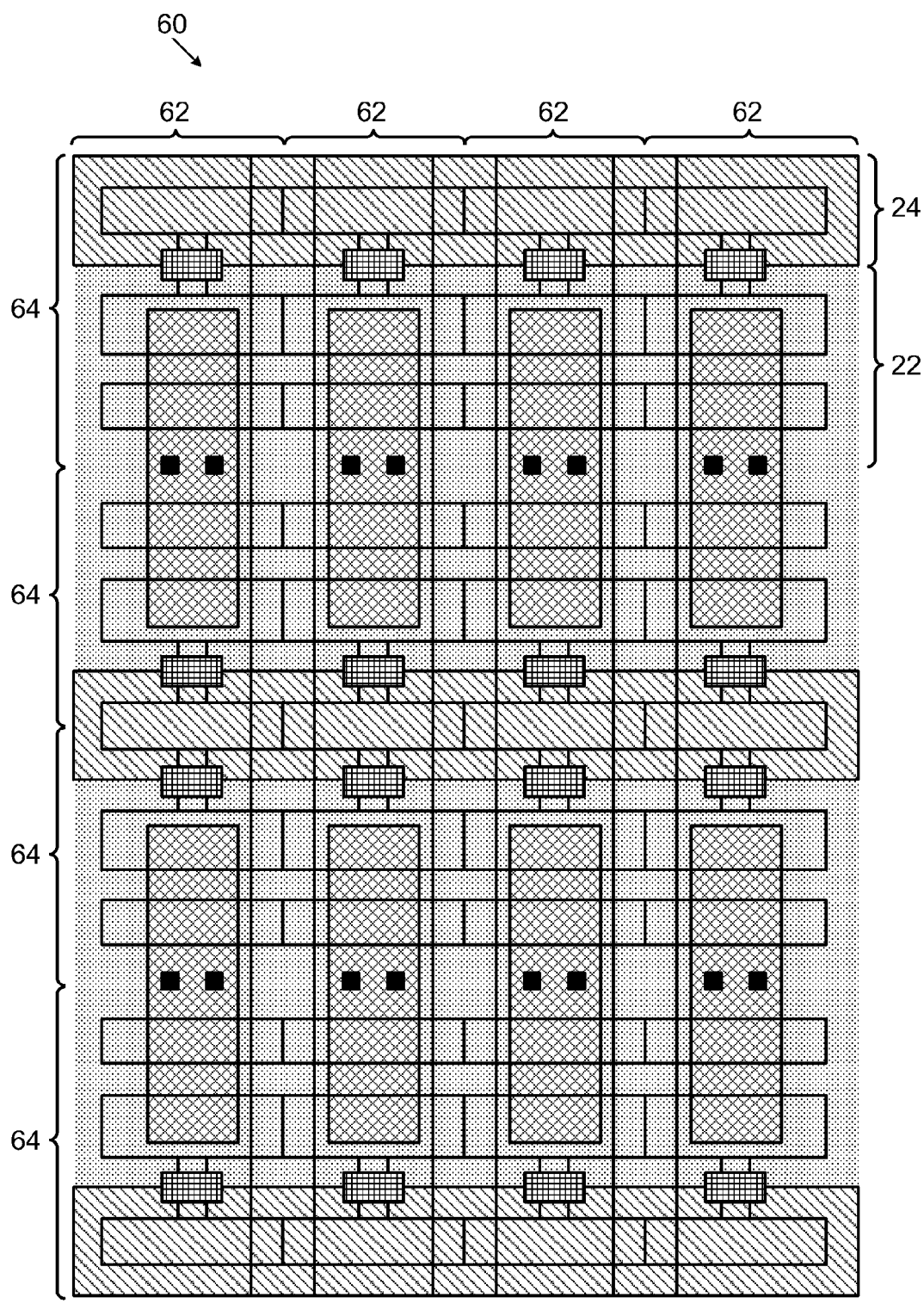
FIG. 3 is a schematic layout of an array of memory cells and emission units in an integrated circuit, in accordance with an embodiment of the present invention.

It can be seen in FIG. 1 that P-N junction 44 is adjacent and in close proximity to anti-fuse device 50. In the pictured embodiment, the distance between junction 44 and device 50 is less than 0.25 µm, which is below the spatial resolution of available infrared detectors, as noted above. Thus, whenever cell 26 iv selected for read by select line 26, junction 44 will be driven to emit radiation, which will dazzle the detector and render any simultaneous radiation from device 50 undetectable. The use of a single P-N junction as the dazzling element is advantageous in this regard in terms of its small size and high brightness. Alternatively, larger or smaller distances and other emitting configurations may be used depending on application requirements and available detection technologies FIG. 3 is a schematic layout of an array 60 of memory cells 22 and emission units 24 in an integrated circuit, in accordance with an embodiment of the present invention. The memory cells and emission units are similar to those shown above in FIG. 1. They are arranged in the embodiment of FIG. 3 in multiple rows 62 and columns 64. Array 60 has a given area and is produced using a set of photolithographic masks. Emission units 24 are contained within this same area and may be produced using the same set of photolithographic masks.

Although the embodiment described above relates to an anti-fuse cell formed on an N-doped substrate, in other embodiments the anti-fuse cell may be formed on a P-doped substrate. In this case, the doping of the emission unit is reversed as well (whereby the direction of the N-P junction is also reversed).

Furthermore, although emission units 24 in the embodiments shown. above are driven to emit radiation directly by the circuitry of the corresponding cells 22 to which they are adjacent, other driving configurations may alternatively be used and are considered to be within the scope of the present invention. For example, when cells 22 are arranged in rows on substrate 21, with emission units 24 in corresponding rows alongside them, all the emission units in a given row may be activated whenever any of the cells in the row are read out. As another example, the circuits used to drive the emission units may be separate from those of the memory cells and controlled by external logic, rather than tied directly to the VPP/VREAD lines of the memory cells. Other geometrical arrangements of the emission units and memory cells may also be used, such as arrangements in which a single emission unit in proximity to one memory cell is sufficiently close to one or more other memory cells to dazzle detectors attempting to measure radiation from the other cells, as well.

It will thus he appreciated that the embodiments described above are cited by way of example, and that the present invention is not limited to what has been particularly shown and described hereinabove. Rather, the scope of the present invention includes both combinations and subcombinations of the various features described hereinabove, as well as variations and modifications thereof which would occur to persons skilled in the art upon reading the foregoing description and which are not disclosed in the prior art.

The invention claimed is:

1. An integrated circuit device, comprising:
   a plurality of memory cells, which are configured to store data; and
   multiple P-N junctions, which are arranged so that a single, respective P-N junction is disposed in proximity to each memory cell and is configured to emit optical radiation during readout from the memory cell with a wavelength matching an emission wavelength of the memory cell.

2. The device according to claim 1, wherein the memory cells comprise anti-fuse cells.

3. The device according to claim 1, wherein the memory cells comprise fuse cells.

4. The device according to claim 1, wherein the memory cells comprise floating gate cells.

5. The device according to claim 1, wherein the memory cells comprise read-only memory (ROM) cells.

6. The device according to claim 1, wherein each memory cell comprises a circuit element that emits during readout from the cell, and wherein the respective P-N junction is located at a distance no greater than 0.5 µm from the circuit element.

7. The device according to claim 1, wherein the P-N junctions are configured as diodes, which are biased to emit the optical radiation.

8. The device according to claim 7, wherein the diodes are poly-silicon diodes.

9. The device according to claim 7, wherein each diode is coupled to a respective memory cell so as to receive a bias and emit the optical radiation when the respective memory cell is read out.

10. The device according to claim 9, and comprising a readout power line, for supplying a voltage to the memory cells during readout, and a diode power line, wherein each diode is coupled between the readout power line to the respective memory cell and the diode power line.

11. The device according to claim 7, wherein the P-N junctions are biased at a level that is selected so as to cause the P-N junctions to emit the optical radiation with the wavelength and a brightness matching an emission of the memory cells.

12. The device according to claim 1, wherein the P-N junctions are coupled to the memory cells so that each P-N junction emits the optical radiation only during readout from the memory cell in proximity to which the P-N junction is disposed.

13. The device according to claim 1, wherein the P-N junctions are coupled to the memory cells so that multiple P-N junctions emit the optical radiation during readout from one or more of the memory cells.

14. The device according to claim 1, wherein the P-N junctions are driven to emit the optical radiation continuously while the device receives electrical power.

15. The device according to claim 1, wherein the memory cells are arranged in an array having a given area and are produced using a set of photolithographic masks, and wherein the P-N junctions are contained within the given area and produced using the same set of photolithographic masks.

16. A method for producing an integrated circuit device, the method comprising:

arranging a plurality of memory cells to store data in the device; and arranging multiple P-N junctions in the device so that a single, respective P-N junction is disposed in proximity to each memory cell and is configured to emit optical radiation during readout from the memory cell with a wavelength matching an emission wavelength of the memory cell.

17. An integrated circuit device, comprising:

means for arranging a plurality of memory cells to store data in the device; and means for arranging multiple P-N junctions in the device so that a single, respective P-N junction is disposed in proximity to each memory cell and is configured to emit optical radiation during readout from the memory cell with a wavelength matching an emission wavelength of the memory cell.

\* \* \* \* \*

UNITED STATES PATENT AND TRADEMARK OFFICE
CERTIFICATE OF CORRECTION

| | | |
|---|---|---|
| PATENT NO. | : 8,760,954 B2 | Page 1 of 1 |
| APPLICATION NO. | : 13/976241 | |
| DATED | : June 24, 2014 | |
| INVENTOR(S) | : Lior Amarilio et al. | |

It is certified that error appears in the above-identified patent and that said Letters Patent is hereby corrected as shown below:

In the Specification

Column 1, line 51, delete "programmed region" and substitute therefor --programmed n+ region--.

Column 2, line 6, delete "disposed, between" and substitute therefor --disposed between--.

Column 3, line 44, delete "arranging r junctions" and substitute therefor --arranging P-N junctions--.

Column 4, line 26, delete "and riot others" and substitute therefor --and not others--.

Column 4, line 57, delete "axe N-doped" and substitute therefor --are N-doped--.

Column 5, line 32, delete "cell 26 iv selected" and substitute therefor --cell 26 is selected--.

Signed and Sealed this
Ninth Day of September, 2014

Michelle K. Lee
*Deputy Director of the United States Patent and Trademark Office*